US009059245B2

(12) United States Patent
Chen et al.

(10) Patent No.: US 9,059,245 B2
(45) Date of Patent: Jun. 16, 2015

(54) SEMICONDUCTOR-ON-INSULATOR (SOI) SUBSTRATES WITH ULTRA-THIN SOI LAYERS AND BURIED OXIDES

(75) Inventors: Tze-Chiang Chen, Yorktown Heights, NY (US); Joel P. de Souza, Putnam Valley, NY (US); Devendra K. Sadana, Pleasantville, NY (US); Ghavam G. Shahidi, Pound Ridge, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 403 days.

(21) Appl. No.: 13/483,781

(22) Filed: May 30, 2012

(65) Prior Publication Data

US 2013/0320483 A1    Dec. 5, 2013

(51) Int. Cl.
*H01L 21/76* (2006.01)
*H01L 21/762* (2006.01)

(52) U.S. Cl.
CPC ................................. *H01L 21/76243* (2013.01)

(58) Field of Classification Search
USPC ................................................. 438/423, 407
See application file for complete search history.

(56) References Cited

U.S. PATENT DOCUMENTS

| 5,196,355 | A | 3/1993 | Wittkower |
| 5,279,978 | A | 1/1994 | See et al. |
| 5,930,643 | A | 7/1999 | Sadana et al. |
| 6,300,218 | B1 | 10/2001 | Cohen et al. |
| 6,602,757 | B2 | 8/2003 | Hovel et al. |
| 6,756,639 | B2 | 6/2004 | Norcott et al. |
| 7,112,509 | B2 | 9/2006 | Erokhin et al. |
| 7,538,351 | B2 | 5/2009 | Chen et al. |
| 7,911,024 | B2 | 3/2011 | Ho et al. |

OTHER PUBLICATIONS

J. P. de Souza et al., "Single Wafer sSOI by SIMOX," Third International SiGe Technology and Device Meeting, ISTDM, May 2006, 2 pages.
Y. Dong et al., "Fabrication of high quality patterned SOI materials by optimized low-dose SIMOX," Proceedings. 2004 IEEE International SOI Conference, Oct. 4-7, 2004, pp. 60-61.

*Primary Examiner* — Samuel Gebremariam
(74) *Attorney, Agent, or Firm* — Scully, Scott, Murphy & Presser, P.C.; Louis J. Percello, Esq.

(57) ABSTRACT

Semiconductor-on-insulator (SOI) substrates including a buried oxide (BOX) layer having a thickness of less than 300 Å are provided. The (SOI) substrates having the thin BOX layer are provided using a method including a step in which oxygen ions are implanted at high substrate temperatures (greater than 600° C.), and at a low implant energy (less than 40 keV). An anneal step in an oxidizing atmosphere follows the implant step and is performed at a temperature less than 1250° C. The anneal step in oxygen containing atmosphere converts the region containing implanted oxygen atoms formed by the implant step into a BOX having a thickness of less than 300 Å. In some instances, the top semiconductor layer of the SOI substrate has a thickness of less than 300 Å.

14 Claims, 8 Drawing Sheets

SEMICONDUCTOR-ON-INSULATOR (SOI) SUBSTRATES WITH ULTRA-THIN SOI LAYERS AND BURIED OXIDES

BACKGROUND

The present disclosure relates to semiconductor manufacturing, and a semiconductor structure that is formed therefrom. More particularly, the present disclosure relates to a method of forming a semiconductor-on-insulator (SOI) substrate containing an ultra-thin SOI layer and an ultra-thin buried oxide layer, a SOI substrate manufactured by the method, as well as semiconductor structures that include the SOI substrate of the present disclosure.

An ultra-thin semiconductor-on-insulator (UTSOI) substrate can be employed to form various semiconductor devices that derive performance advantage through a reduced thickness of a top semiconductor layer and/or a reduced thickness of the buried insulator layer compared with normal semiconductor-on-insulator (SOI) substrates.

For example, the reduction in the thickness of the top semiconductor layer provides full depletion of the channel, thereby enhancing the electrical control of the channel by the gate electrode and reducing the leakage current in a field effect transistor. Further, the reduction in the thickness of the buried insulator layer can enhance control by a back gate electrode in back-gated field effect transistors.

SUMMARY

Semiconductor-on-insulator (SOI) substrates including a buried oxide (BOX) layer having a thickness of less than 300 Å are provided. The SOI substrates of the present disclosure having the thin BOX layer are provided using a method including a step in which oxygen ions are implanted at high substrate temperatures (greater than 600° C.), and at a low implant energy (less than 40 keV). An anneal step in an oxidizing atmosphere follows the implant step and is performed at a temperature lower than 1250° C. The anneal step converts the region containing implanted oxygen atoms formed by the implant step into a BOX having a thickness of less than 300 Å.

In one aspect, a method of forming a semiconductor-on-insulator substrate is provided. The method includes providing a semiconductor substrate. Oxygen ions are then implanted into a semiconductor material portion of the semiconductor substrate at a substrate temperature of greater than 600° C. utilizing an ion implant energy of less than 40 keV to form an implanted region containing oxygen ions within the semiconductor material portion of the semiconductor substrate. Next, the semiconductor substrate including the implanted region is annealed in an atmosphere containing oxygen and at a temperature of less than 1250° C. which converts the implanted region containing oxygen ions into a buried oxide layer having a thickness of less than 300 Å located between a top semiconductor layer and a bottom semiconductor layer.

In another aspect, a method of forming a semiconductor-on-insulator substrate is provided that includes providing a buried oxide layer and a buried dielectric material layer. This method of the present disclosure includes a semiconductor substrate including a material layer selected from a Si-based dielectric material or porous Si positioned between a top semiconductor layer and a bottom semiconductor layer. Oxygen ions are then implanted into a semiconductor material portion of the semiconductor substrate at a substrate temperature of greater than 600° C. utilizing an ion implant energy of less than 40 keV to form an implanted region containing oxygen ions within the semiconductor material portion of the semiconductor substrate. The semiconductor substrate including the implanted region and the material layer is then annealed in an atmosphere containing oxygen and at a temperature of less than 1250° C. which converts the implanted region containing oxygen ions into a buried oxide layer having a thickness of less than 300 Å located within the semiconductor material portion of the semiconductor substrate.

In yet another aspect of the present disclosure, a semiconductor structure is provided that includes a buried oxide layer having a thickness of less than 300 Å located between a top semiconductor layer and a bottom semiconductor layer.

In a still yet other aspect of the present disclosure, a semiconductor structure is provided that includes a buried oxide layer having a thickness of less than 300 Å, and a dielectric material, wherein both the buried oxide and the dielectric material layer are located between a top semiconductor layer and a bottom semiconductor layer.

DETAILED DESCRIPTION

The present disclosure, which relates to a method of forming a semiconductor-on-insulator (SOI) substrate containing an ultra-thin SOI layer and an ultra-thin buried oxide layer, a SOI substrate manufactured by the method, as well as semiconductor structures that include the SOI substrate of the present disclosure, will now be described in greater detail by referring to the following discussion and drawings that accompany the present application. It is noted that the drawings of the present application are provided for illustrative purposes and, as such, they are not drawn to scale. For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

As mentioned above, an ultra-thin semiconductor-on-insulator (UTSOI) substrate can be employed to form various semiconductor devices that derive performance advantage through a reduced thickness of a top semiconductor layer and/or a reduced thickness of the buried insulator layer compared with normal semiconductor-on-insulator (SOI) substrates. While UTSOI substrates are promising candidates for use in forming advanced high performance devices, the formation of SOI substrates containing ultra-thin buried insulator layers having a thickness of less than 400 Å by oxygen implantation has not been demonstrated.

The present disclosure solves the above problem by using a method which includes a step in which oxygen ions are implanted into a semiconductor material portion of a semiconductor substrate at high substrate temperatures (greater than 600° C.), and at a low implant energy (less than 40 keV). An oxygen anneal step follows the implant step and is performed at a temperature less than 1250° C. The oxygen anneal step converts the implanted region containing oxygen ions formed by the implant step into a BOX layer having a thickness of less than 300 Å. The foregoing method provides semiconductor structures, e.g., semiconductor-on-insulator (SOI) substrates, which include a buried oxide (BOX) layer having a thickness of less than 300 Å. In some embodiments, the top semiconductor layer of the SOI substrate has a thickness of less than 300 Å. As such, the present disclosures can provide UTSOI substrates.

Figure 1:
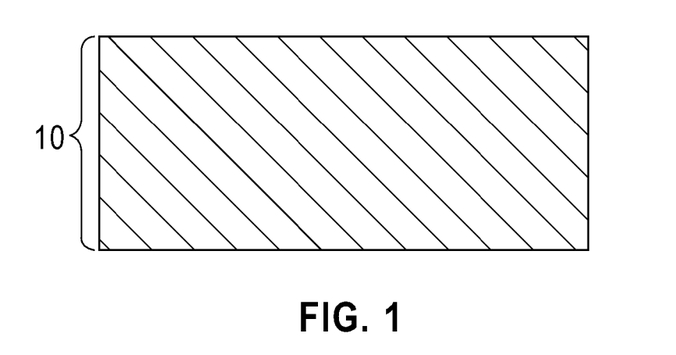
FIG. 1 is a pictorial representation (through a cross sectional view) illustrating a semiconductor substrate that can be employed in one embodiment of the present disclosure.

Reference is now made to FIG. 1, which illustrates a semiconductor substrate 10 that can be employed in one embodiment of the present disclosure. In this embodiment, semiconductor substrate 10 is comprised of a bulk semiconductor material. By "bulk" it is meant that the entirety of the semiconductor substrate 10 is comprised of semiconductor material. In one embodiment, the semiconductor substrate 10 may comprise a single layered semiconductor material. In another embodiment, the semiconductor substrate 10 may comprise two or more semiconductor materials. In one embodiment, the two or more semiconductor materials can be of the same semiconductor composition. In another embodiment, the two or more semiconductor materials can be comprised of different semiconductor materials. In such an embodiment, the two or more semiconductor materials can be latticed mismatched such that a strain is formed in the semiconductor substrate 10.

The term "semiconductor material" as used herein to describe the semiconductor substrate 10 comprises any material having semiconducting properties which can be subsequently converted into a semiconductor-on-insulator (SOI) substrate utilizing the method of the present disclosure, i.e., by implanting oxygen ions into the substrate and then annealing in an atmosphere containing oxygen. Typically, the semiconductor material of the semiconductor substrate 10 comprises one of silicon (Si), silicon germanium (SiGe) alloys, and other Si-containing semiconductor compounds. In one embodiment, the semiconductor substrate 10 is comprised of silicon.

In some embodiments, the semiconductor substrate 10 can be intrinsic, i.e., made of exceedingly pure semiconductor material. In other embodiments, the semiconductor substrate 10 can be partially or completely doped with small quantities of other elements (such as, for example, elements from Group III or Group V of the Periodic Table of Elements) which can be added to change in a controlled manner the semiconducting properties of the semiconductor substrate 10.

In some embodiments, the entirety, or a portion, of the semiconductor substrate 10 can comprise a single-crystalline semiconductor material. The term "single-crystalline" is used throughout the present disclosure to denote that the substrate 10 comprises a semiconductor material in which the crystal lattice of the entire substrate is continuous, unbroken (with no grain boundaries) to its edges. In other embodiments, the entirety, or a portion, of the semiconductor substrate 10 can comprise a polycrystalline semiconductor material. The term "polycrystalline" is used throughout the present disclosure to denote a semiconductor material which is composed of a number of smaller crystals or crystallites. In yet other embodiments, the entirety, or a portion, of the semiconductor substrate 10 can comprise an amorphous semiconductor material. The term "amorphous" denotes that the semiconductor material lacks a well-defined crystal structure. Typically, the semiconductor substrate 10 is comprised of single-crystal silicon. In some embodiments, the semiconductor substrate is comprised of silicon having a (100) orientation.

The semiconductor substrate 10 can be used as is, or the semiconductor substrate 10 may be cleaned prior to use to remove any contaminants which may be present in or on the substrate. Any of the well known cleaning methods known to those skilled in the art may be employed in the present disclosure to remove contaminants from the semiconductor substrate 10.

Figure 2:
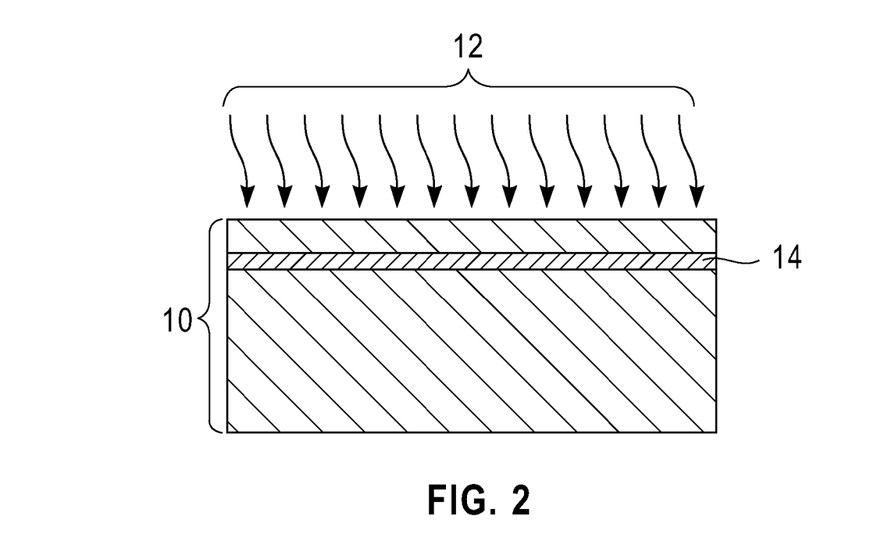
FIG. 2 is a pictorial representation (through a cross sectional view) illustrating the semiconductor substrate of FIG. 1 during a step of implanting oxygen ions into a semiconductor material portion of the semiconductor substrate at a substrate temperature of greater than 600° C. utilizing an ion implant energy of less than 40 keV to form an implanted region containing oxygen ions within the semiconductor material portion of the semiconductor substrate.

Referring now to FIG. 2, there is illustrated the semiconductor substrate 10 of FIG. 1 during a step of implanting oxygen ions 12 into a semiconductor material portion of the semiconductor substrate 10 to form an implanted region 14 containing oxygen ions within the semiconductor material portion of the semiconductor substrate 10. In the embodiment illustrated, the implant of oxygen ions 12 occurs continuously across the entirety of the semiconductor substrate 10 such that a contiguous, i.e., without breaks, implanted region 14 is formed. The step of implanting oxygen ions 12 can occur in a single implant step or multiple steps of implanting oxygen ions can be performed. When multiple steps of implanting oxygen ions are employed, the same or different implant conditions can be used so long as the implant conditions that are employed are performed at high substrate temperatures and low ion implant energy, as to be defined herein below.

In the present disclosure, applicants have determined that if the implanting of oxygen ions 12 is performed at specific conditions, as defined in greater detail herein below, a buried oxide layer having a thickness of less than 300 Å can be formed. In some embodiments, the same conditions can also be used in forming a top semiconductor layer having a thickness of less than 300 Å. Moreover, it was determined that buried oxide layers having a thickness of less than 300 Å can be formed, if the step of implanting oxygen ions 12 is performed at high substrate temperatures (greater than 600° C.), and at a low implant energy (less than 40 keV). When one or more of the above conditions are not satisfied, the resultant buried oxide layer will have a thickness which exceeds the thickness of the buried oxide layers which are obtained in the present disclosure. Also, if one or more of the above conditions are not satisfied, the resultant buried oxide will be non-continuous.

In the present disclosure, the step of implanting oxygen ions 12 into the semiconductor substrate 10 is performed in an ion implantation apparatus. The ion implantation apparatus that can be used in the present disclosure typically includes an oxygen ion source, where oxygen ions are produced, an accelerator, where the oxygen ions are electrostatically accelerated to a high energy, and a target chamber, where the oxygen ions impinge on the substrate 10.

As stated above, the step of implanting oxygen ions 12 in the present disclosure is performed at a substrate temperature that is greater than 600° C. By "substrate temperature" it is meant the temperature that is measured from a surface of the semiconductor substrate 10. In one embodiment, the step of implanting oxygen ions 12 can be performed at a substrate temperature from greater than 600° C. up to 700° C. In yet another embodiment, the step of implanting oxygen ions 12 can be performed at a substrate temperature from 620° C. to 650° C.

In the present disclosure, lamp heating (via, for example, halogen lamps) or resistive heating is performed before starting the implantation process to achieve a substrate temperature above 200° C. The lamp heater and resistive heating element are typically located within the ion implantation reactor chamber. Beam heating is also present during the implantation process and the beam energy can also be used to maintain the substrate temperature above 600° C. In some embodiments, lamp heating or resistive heating can be shut down and the temperature of the implantation process can be maintained solely by the beam energy. In other embodiments, the substrate temperature can be maintained using both beam energy and lamp heating or resistive heating.

In some embodiments of the present disclosure, the implantation process can be performed utilizing a beam energy power, i.e., ion acceleration voltage time ion beam current, of from 50 Watts to 2000 Watts.

As stated above, the step of implanting oxygen ions 12 in the present disclosure is performed at a low ion implant energy (i.e., less than 40 keV). In one embodiment, the step of implanting oxygen ions 12 can be performed at an ion implant energy from 15 keV to less than 40 keV.

In addition to the above conditions, the step of implanting oxygen ions 12 includes selecting one of singularly ionized oxygen, doubly ionized oxygen, multiple ionized oxygen, molecular oxygen or atomic oxygen as a source of oxygen ions.

In one embodiment, the step of implanting oxygen ions 12 is performed utilizing a dose, i.e., concentration, of oxygen ions from $1 \times 10^{16}$ atoms/cm$^2$ to $5 \times 10^{16}$ atoms/cm$^2$. In another embodiment, the step of implanting oxygen ions 12 is performed utilizing a dose, i.e., concentration, of oxygen ions from $2 \times 10^{16}$ atoms/cm$^2$ to $3 \times 10^{16}$ atoms/cm$^2$.

Using the above defined substrate temperature and ion implant energy, the implanted oxygen ions are distributed to a depth according to a Gaussian distribution wherein the profile peak, i.e., projected range, increases with ion energy.

It is noted that the lower ion implant energy employed in the present disclosure provides a narrow Gaussian depth distribution of the oxygen atoms and thus confines the subsequently formed buried oxide layer within the peak of the implanted region, and that the high substrate temperature allows enough dynamic heating during the implant to avoid formation of an amorphous layer in the implanted region. By "narrow" implant region it is meant two times the standard deviation of the depth profile at a specific implant energy.

Figure 3:
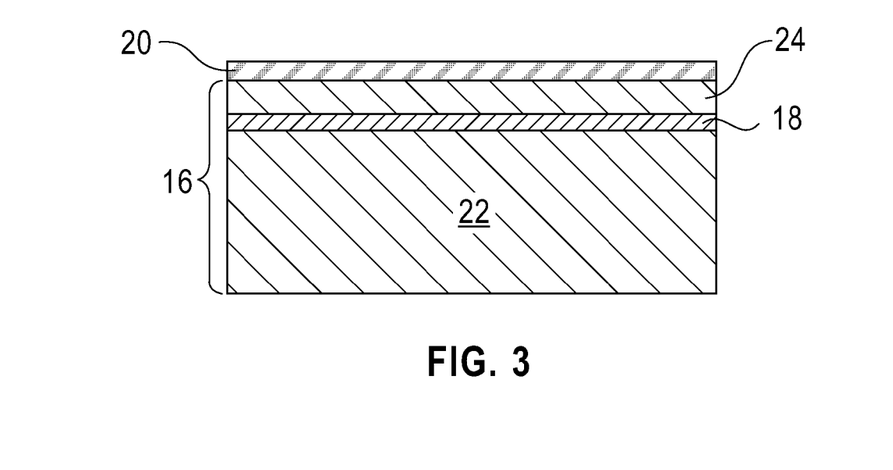
FIG. 3 is a pictorial representation (through a cross sectional view) illustrating the structure of FIG. 2 after annealing the semiconductor substrate including the implanted region in an atmosphere containing oxygen and at a temperature of less than 1250° C. which converts the implanted region containing oxygen ions into a buried oxide layer having a thickness of less than 300 Å located between a top semiconductor layer and a bottom semiconductor layer, and a surface oxide layer.

Referring now to FIG. 3, there is illustrated the structure of FIG. 2 after annealing the semiconductor substrate 10 including the implanted region 14 containing oxygen ions in an atmosphere containing oxygen to form semiconductor-on-insulator substrate 16 including a buried oxide layer 18 having a thickness of less than 300 Å located between a top semiconductor layer 24 and a bottom semiconductor layer 22. The top and bottom semiconductor layers 24, 22 are remaining semiconductor portions of the semiconductor substrate 10 which were not converted into a buried oxide layer. During the anneal step of the present disclosure, a surface oxide layer 20 as illustrated in FIG. 3 also forms on an uppermost surface of the top semiconductor layer 24. Although not shown, a surface oxide would also form on the exposed vertical edges and the bottommost surface of the semiconductor substrate 10.

The anneal which is employed to convert implanted region 14 containing oxygen ions into buried oxide layer 18 is performed at a temperature of less than 1250° C. In some embodiments, the anneal which is employed to convert implanted region 14 containing oxygen ions into buried oxide layer 18 is performed at a temperature from 1050° C. to less than 1250° C. In some cases, the anneal which is employed to convert implant region 14 containing oxygen ions into buried oxide layer 18 is typically performed at a temperature from 1110° C. to 1150° C.

The anneal which is employed to convert implanted region 14 containing oxygen ions into buried oxide layer 18 can be carried out in an inert gas atmosphere that is mixed with from 0.1 to 10% oxygen. By "inert gas" it is meant one of helium (He), argon (Ar), neon (Ne), and krypton (Kr). In some embodiments, nitrogen can be used with the atmosphere containing oxygen. In yet another embodiment, a nitrogen/inert gas mixture can be used with the atmosphere containing oxygen. By "atmosphere containing oxygen" it is meant an ambient that includes oxygen or a source of oxygen. In another embodiment, a chlorine containing vapor can be mixed in the annealing atmosphere together with oxygen and an inert gas. In such an embodiment, the chlorine containing vapor can be selected from HCl, 1,1,1-trichloroethylene, 1,2-transdichloroethylene and other like chlorine containing compounds that can be formed into a vapor. In some embodiments, the ratio of chlorine-containing vapor, e.g., HCl, to oxygen is less than 0.3%.

In one embodiment, the anneal which is employed to convert implanted region 14 containing oxygen ions into buried oxide layer 18 may be performed by continuously ramping the temperature of the structure from an initial starting temperature to the desired anneal temperature. In another embodiment, various hold or so-called 'soak cycles' may be included in the anneal step. In such an embodiment in which soak-cycles are employed the temperature between each soak cycle can be increased utilizing a same ramp rate or various ramp rates can be employed between each soak-cycle.

The buried oxide layer 18 that is formed in this embodiment has a thickness of less than 300 Å. In some embodiments, the buried oxide layer 18 can have a thickness of from 200 Å to less than 300 Å. In other embodiments, the buried oxide layer 18 can have a thickness from 100 Å to 300 Å.

In one embodiment of the present disclosure, the top semiconductor layer 24 can have a thickness of less than 300 Å. In another embodiment, the top semiconductor layer 24 can have a thickness of from 100 Å to 400 Å. In other embodiments, the top semiconductor layer can have a thickness from 200 Å to 300 Å. Other thickness that are lesser than or greater than the ranges mentioned above for the top semiconductor layer 24 can also be obtained.

In one embodiment, the surface oxide layer 20 that forms on an uppermost surface of the top semiconductor layer 24 during the anneal has a thickness from 50 Å to 400 Å. In another embodiment, the surface oxide layer 20 that forms on an uppermost surface of the top semiconductor layer 24 during the anneal has a thickness from 100 Å to 200 Å. The surface oxide that is formed on the vertical edges and the bottommost surface of the semiconductor substrate 10 would have similar thicknesses.

Figure 4:
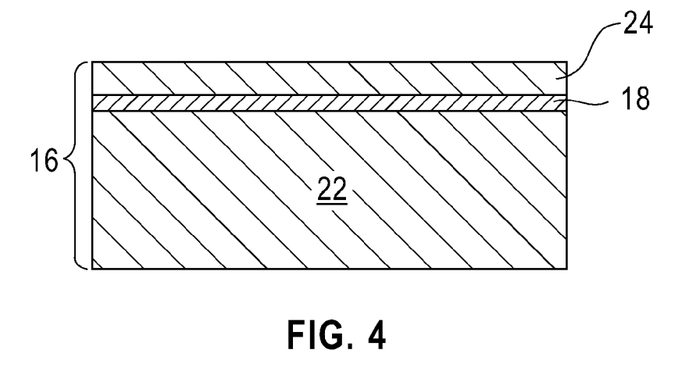
FIG. 4 is a pictorial representation (through a cross sectional view) illustrating the structure of FIG. 3 after removing the surface oxide layer that formed atop the top semiconductor layer during the annealing step.

Referring now to FIG. 4, there is illustrated the structure of FIG. 3 after removing the surface oxide layer 20 that formed atop the top semiconductor layer 24; the surface oxide that is present on the vertical edges and the bottommost surface of the semiconductor substrate 10 can also be removed at this point of the present disclosure. In some embodiments, the surface oxide layer 20 can remain atop the top semiconductor layer 24. In embodiments in which the surface oxide layer 20 is removed, the surface oxide layer 20 can be removed by etching. In one embodiment, an HF etchant can be employed to remove the surface oxide layer 20 from the structure.

Notwithstanding whether the surface oxide layer 20 (and the surface oxide layer present on the vertical edges and bottommost surface of the semiconductor substrate 10) remains or is removed from the structure, the method of the present disclosure provides a semiconductor structure, e.g., SOI substrate 16, that includes buried oxide layer 18 having a thickness of less than 300 Å that is located between top semiconductor layer 24 and bottom semiconductor layer 22. See, FIGS. 3-4, for example. In the embodiment that is illustrated the buried oxide layer 18 is a contiguous buried oxide layer, i.e., it spans the entire length of the substrate.

In some embodiments, a semiconductor material layer (not shown) can be epitaxially grown on the top semiconductor layer 24. In some embodiments, the semiconductor material layer that can be epitaxially grown can be a same semiconductor material as the top semiconductor layer 24. In such an embodiment, the semiconductor material layer that is epitaxially grown increases the thickness of the top semiconductor layer 24. In some embodiments, the semiconductor material layer that can be epitaxially grown on the top semiconductor layer 24 comprises a different semiconductor material than the top semiconductor layer 24. In such an embodiment, the semiconductor material layer that can be epitaxially grown can introduce a strain into the top semiconductor layer 24. The semiconductor material layer that can be epitaxially grown on the top semiconductor layer 24 has a same crystallographic orientation as the underlying top semiconductor layer 24. Epitaxial films may be grown from gaseous or liquid precursors as known to those skilled in the art. In some embodiments of the present disclosure, the semiconductor layer 24 can be thinned down either by controlled etching or by oxidation followed by oxide removal.

Reference is now made to FIGS. 5, 6, 7 and 8 which illustrate another embodiment of the present disclosure. In this embodiment, a semiconductor structure, e.g., SOI substrate, including a non-contiguous buried oxide layer having a thickness of less than 300 Å is provided.

This embodiment of the present disclosure begins by selecting a semiconductor substrate, such as, for example, semiconductor substrate 10 shown in FIG. 1. After selecting the semiconductor substrate, a blanket layer of a mask material (not shown) is formed atop the semiconductor substrate. The blanket layer of mask material can be formed utilizing a deposition process including, for example, chemical vapor deposition (CVD), plasma enhanced chemical vapor deposition (PECVD), evaporation, chemical solution deposition and spin-on coating. The blanket layer of mask material may comprise any hard mask material including for example inorganic hard mask materials. Illustrative examples of inorganic mask materials include, but are not limited to, oxides, nitrides and/or oxynitrides. The thickness of the blanket layer of mask material that is formed is generally thick enough to prevent oxygen ions from being implanted through the mask material. In one embodiment, the blanket layer of mask material has a thickness from 200 nm to 300 nm.

Figure 5:
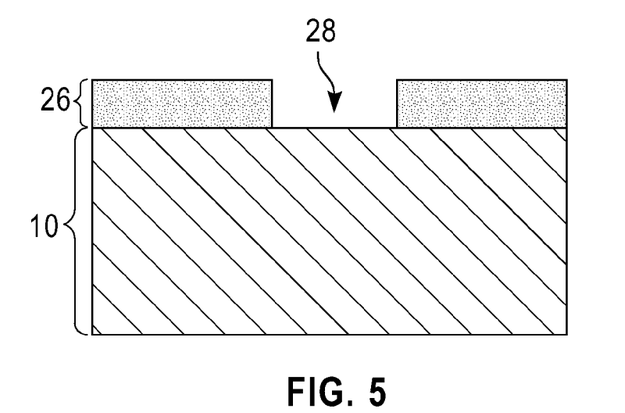
FIG. 5 is a pictorial representation (through a cross sectional view) illustrating the semiconductor substrate of FIG. 1 after forming a mask having at least one opening atop the semiconductor substrate.

Referring now to FIG. 5, there is illustrated the structure which is formed after patterning the blanket layer of mask material into mask 26 which has at least one opening 28 atop the semiconductor substrate 10. The at least one opening 28 exposes at least one portion of the semiconductor substrate 10 such that oxygen ions can be implanted into a semiconductor material portion that is located substantially beneath the at least one opening 28. The width of the at least one opening 28 will determine the width of the resultant implanted region and buried oxide layer to be subsequently formed within the semiconductor substrate 10. Typically, the at least one opening 28 has a width as measured from one vertical sidewall of the mask 26 to another vertical sidewall of the mask 26 that is greater than, or equal to, 200 Å.

The patterning of the blanket layer of mask material can be performed by lithography and etching. Lithography includes forming a photoresist atop the blanket layer of mask material, exposing the photoresist to a desired pattern of radiation and developing either the exposed or unexposed portions of the photoresist. After development, an etching step such as dry etching or wet etching can be employed. Dry etching includes one of reactive ion etching, ion beam etching, plasma etching or laser ablation. Wet etching includes the use of a chemical etchant.

Figure 6:
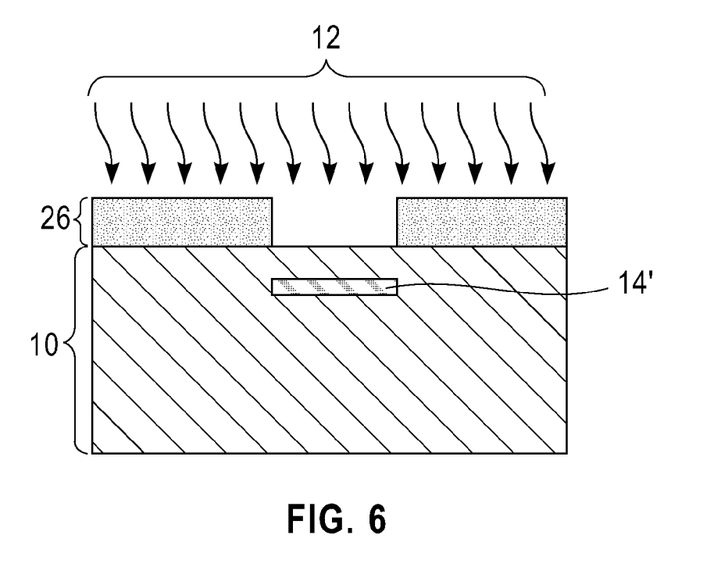
FIG. 6 is a pictorial representation (through a cross sectional view) illustrating the structure of FIG. 5 during a step of implanting oxygen ions into a semiconductor material portion of the semiconductor substrate at a substrate temperature of greater than 600° C. utilizing an ion implant energy of less than 40 keV to form an implanted region containing oxygen ions within the semiconductor material portion of the semiconductor substrate.

Referring now FIG. 6, there is illustrated the structure of FIG. 5 during a step of implanting oxygen ions 12 into a semiconductor material portion of the semiconductor substrate 10 to form an implanted region 14' containing oxygen within the semiconductor material portion of the semiconductor substrate 10. In this embodiment, the implanted region 14' is non-contiguous, i.e., it does not span the entire length of the substrate 10. Instead, the implanted region 14' is restricted by the width of the at least one opening 28 that is formed in the blanket layer of mask material. The conditions used for the step of implanting oxygen ions 12 in this embodiment are the same as those mentioned above for the embodiment depicted in FIG. 2.

Figure 7:
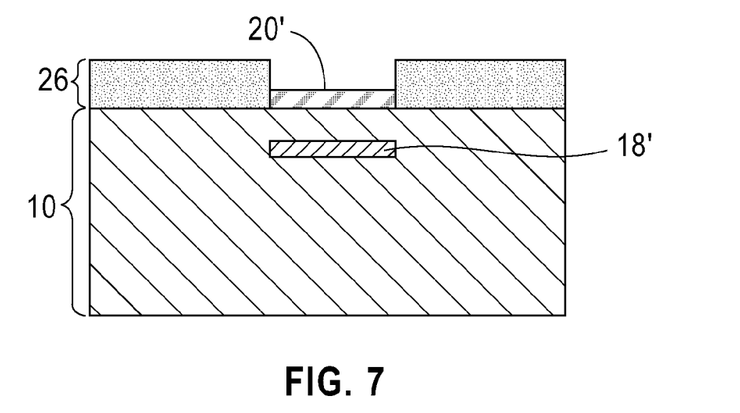
FIG. 7 is a pictorial representation (through a cross sectional view) illustrating the structure of FIG. 6 after annealing the semiconductor substrate including the implanted region in an atmosphere containing oxygen and at a temperature of less than 1250° C. which converts the implanted region containing oxygen ions into a buried oxide layer having a thickness of less than 300 Å located between a top semiconductor layer and a bottom semiconductor layer.

Referring now to FIG. 7, there is illustrated the structure of FIG. 6 after annealing the semiconductor substrate 10 including the non-continuous implanted region 14' in an atmosphere containing oxygen which converts the non-continuous implanted region 14' into a buried oxide layer 18' that is non-contiguous and has a thickness of less than 300 Å located between a top semiconductor layer 24 and a bottom semiconductor layer 26. The anneal step employed in this embodiment is the same as that described above in conjunction with forming the structure illustrated in FIG. 3. During the anneal of this embodiment, a surface oxide layer 20' forms on the exposed portions of the substrate 10 between the mask 26; note that a surface oxide layer also forms on the vertical edges and bottommost surface of the semiconductor substrate 10.

Figure 8:
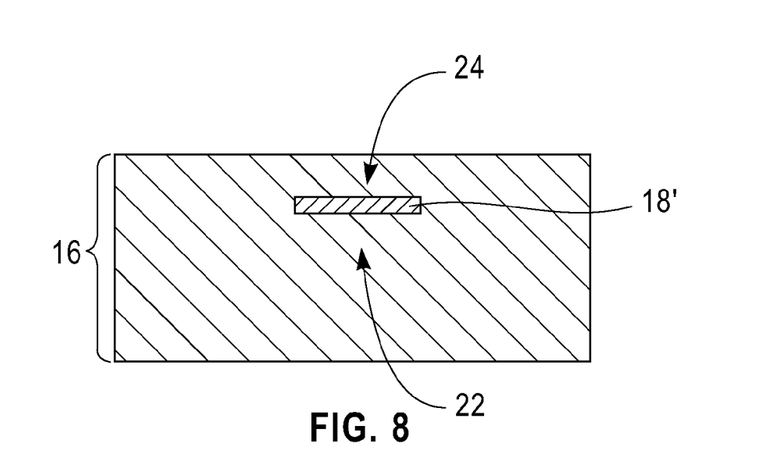
FIG. 8 is a pictorial representation (through a cross sectional view) illustrating the structure of FIG. 7 after removing the mask and a surface oxide layer that formed atop the top semiconductor layer during the annealing.

Referring now to FIG. 8, there is illustrated the structure of FIG. 7 after removing the mask 26 and surface oxide layer 20' (as well as the surface oxide that formed on the vertical edges and bottommost surface of the semiconductor substrate 10) that formed atop the top semiconductor layer 24 of the SOI substrate 16'. In some embodiments, the surface oxide layer 20' may remain and only the mask 26 is removed. The mask 26 can be removed at the same time or in a separate step, either before or after, the surface oxide layer 20' is removed. An etchant such as HF can be used to remove the surface oxide layer 20' and optionally the mask 26. When the mask 26 is removed separately from surface oxide layer 20', an etchant that selectively removes the mask 26 can be employed.

In some embodiments, the mask 26 can be removed prior to annealing in the atmosphere containing oxygen. In such an embodiment, the surface oxide layer 20' would form atop the entire upper surface of substrate 10.

Notwithstanding whether the surface oxide layer 20' remains or is removed from the structure, the method of the present disclosure provides a semiconductor structure, e.g., SOI substrate 16, that includes buried oxide layer 18' having a thickness of less than 300 Å that is located between top semiconductor layer 24 and bottom semiconductor layer 22. See, FIGS. 7-8, for example. In the embodiment that is illustrated, the buried oxide layer 18' is a non-contiguous buried oxide layer, i.e., it doesn't span the entire length of the substrate.

Reference is now made to FIGS. 9-12B which illustrate another embodiment of the present disclosure. This embodiment is similar to the embodiment disclosed in FIGS. 1-4 except that the initial substrate employed is a semiconductor-on-insulator substrate 50 which includes a material layer 56 located between a top semiconductor layer 54 and a bottom semiconductor layer 52. See, FIG. 9.

Figure 9:
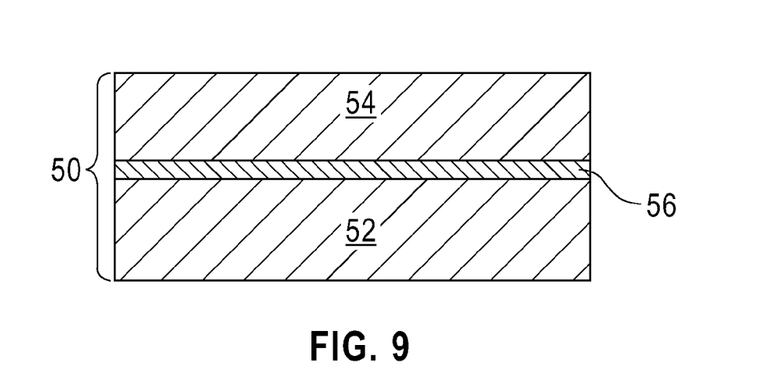
FIG. 9 is a pictorial representation (through a cross sectional view) illustrating another semiconductor substrate with a buried dielectric layer or a porous Si layer that can be employed in one embodiment of the present disclosure.

In one embodiment, the material layer 56 is a Si-based dielectric material such as silicon oxide, silicon nitride and/or silicon oxynitride. In some embodiments, porous Si could be used as a material layer 56 which upon subsequent anneal forms cavities within substrate 50. In the following illustrated embodiment, material layer 56 is composed of a Si-based dielectric material which remains as a buried dielectric material in the final structure after performing the annealing step of the present disclosure.

The top and bottom semiconductor layers 54, 52 may comprise a same or different semiconductor material including one of the semiconductor materials mentioned above for substrate 10. In one embodiment, the top semiconductor layer 54 is comprised of a Si-containing semiconductor material such as, for example, Si or SiGe.

The thickness of the material layer 56 is typically in the range from 100 Å to 1 micron, with a thickness from 100 Å to 1500 Å being more typical. The thickness of the top semiconductor layer 54 is typically in the range from 100 Å to 2000 Å. Other thicknesses that are above the ranges are also can be employed for the material layer 56 and the top semiconductor layer 54 of SOI substrate 50.

In one embodiment, the SOI substrate 50 can be formed utilizing a process in which ions are implanted into a semiconductor substrate and then annealed. Alternatively, the SOI substrate 50 can be formed by a layer transfer process which includes a bonding step. In such a process, at least one of the semiconductor layers to be bonded includes the material layer 56 formed thereon. In such an embodiment, the material layer 56 can be formed on at least one of the semiconductor layers via a conventional deposition process. When porous Si is used as the material layer 56, porous Si can be formed utilizing any conventional anodization of silicon process which converts a Si-containing material into porous Si. In some embodiments, Si or and epitaxial Si layer can be formed on top of the porous silicon layer.

Figure 10A:
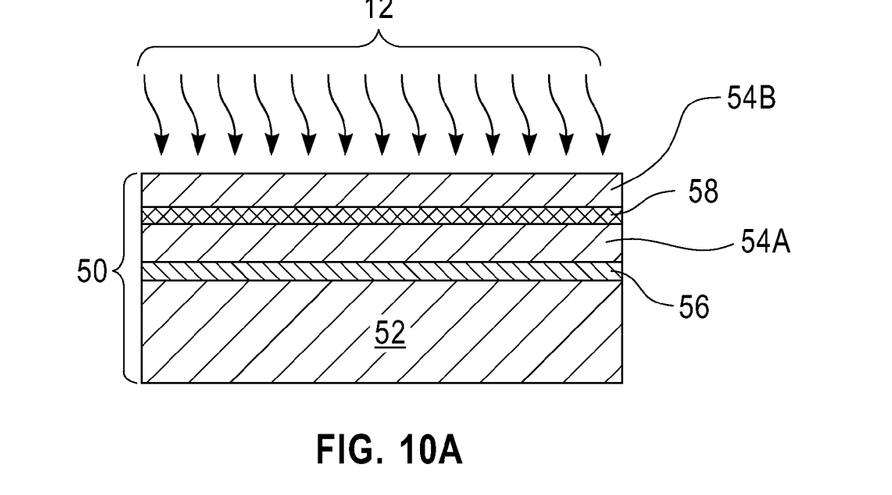
FIGS. 10A and 10B are pictorial representations (through cross sectional views) illustrating the semiconductor substrate of FIG. 9 during a step of implanting oxygen ions into a semiconductor material portion of the semiconductor substrate at a substrate temperature of greater than 600° C. utilizing an ion implant energy of less than 40 keV to form an implanted region containing oxygen ions within the semiconductor material portion of the semiconductor substrate.

Reference is now made to FIGS. 10A and, 10B which illustrate the semiconductor substrate 50 of FIG. 9 during a step of implanting oxygen ions 12 into a semiconductor material portion of the semiconductor substrate 50 to form implanted region 58 containing oxygen ions within the semiconductor material portion of the semiconductor substrate. The step of implanting oxygen ions 12 employed in any of these illustrated embodiments within FIGS. 10A and 10B is performed utilizing the same conditions as mentioned above in connection with providing the implanted region 14 shown in FIG. 2.

FIG. 10A represents an embodiment wherein the implanted region 58 containing oxygen ions is located above, but not in direct physical contact with the material layer 56. In this embodiment, a top semiconductor portion 54B of top semiconductor layer 54 remains above the implanted region 58, while a bottom semiconductor portion 54A of top semiconductor layer 54 remains below the implanted region 58.

Figure 10B:
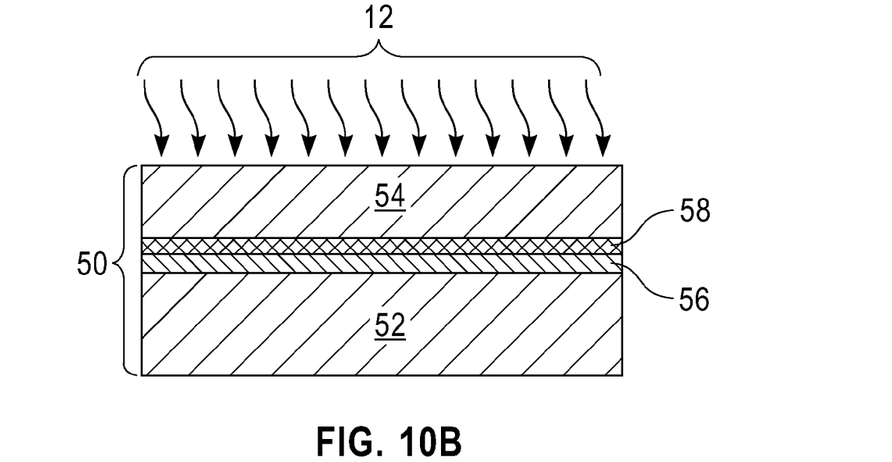

FIG. 10B represents an embodiment wherein the implanted region 58 containing oxygen is located above and in direct physical contact with the material layer 56. In this embodiment, a portion of top semiconductor layer 54 remains above the implanted region 58.

Figure 11A:
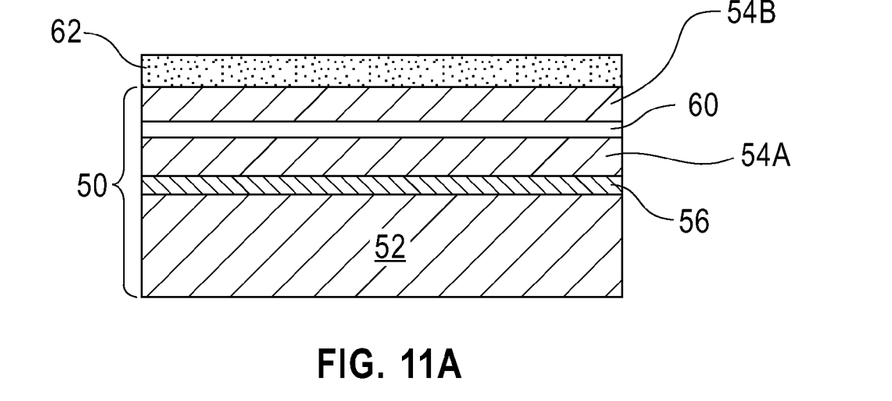
FIGS. 11A and 11B are pictorial representations (through cross sectional views) illustrating the structure of FIGS. 10A and 10B, respectively, after annealing the semiconductor substrate including the implanted region in an atmosphere containing oxygen and at a temperature of less than 1250° C. which converts the implanted region containing oxygen ions into a buried oxide layer having a thickness of less than 300 Å located between a top semiconductor layer and a bottom semiconductor layer.
Figure 11B:
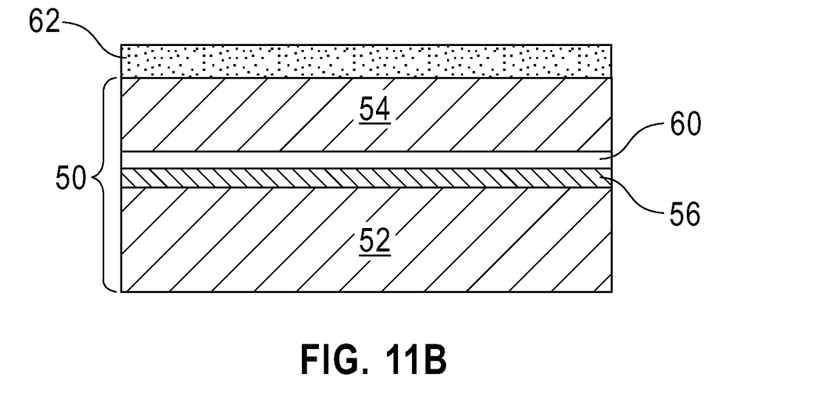

Referring now to FIGS. 11A and 11B, there are illustrated the structures of FIGS. 10A and 10B, respectively, after annealing which converts the implanted region into a buried oxide layer 60 having a thickness of less than 300 Å located between a top semiconductor layer 54 and a bottom semiconductor layer 52. The anneal employed for these illustrated embodiments is the same as that mentioned above for forming the structure shown in FIG. 3. In each illustrated embodiment depicted in FIGS. 11A, and 11B, the position of the buried oxide layer 60 coincides with the location of the implanted region 58 mentioned in FIGS. 10A and 10B.

A surface oxide layer 62 as depicted in FIGS. 11A and 11B also forms. Surface oxide layer 62 has the same characteristics as that mentioned above for surface oxide layer 20. Although not shown, a surface oxide layer also forms on the vertical edges and bottommost surface of the substrate.

Figure 12A:
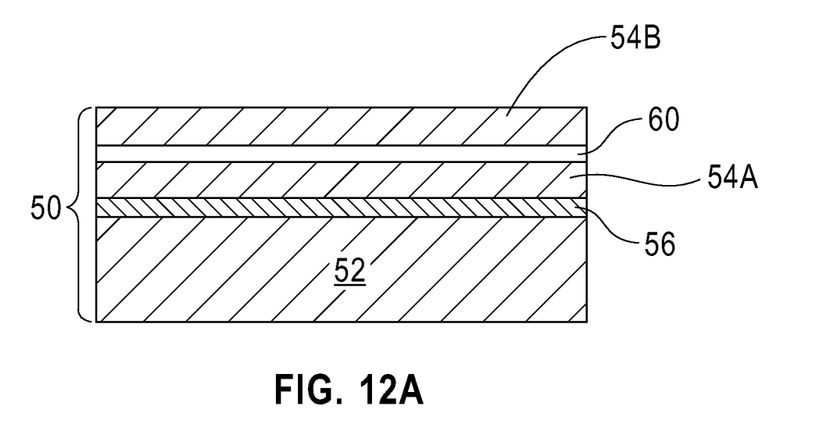
FIGS. 12A and 12B are pictorial representations (through cross sectional views) illustrating the structure of FIGS. 11A and 11B, respectively, after removing a surface oxide layer that formed atop the top semiconductor layer during the annealing.
Figure 12B:
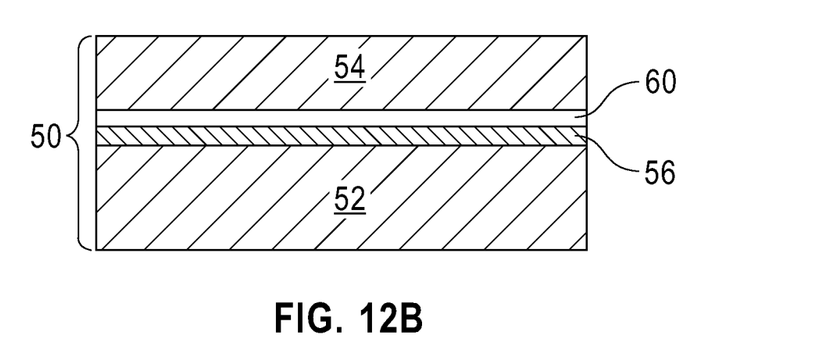

Referring now to FIGS. 12A and 12B, there are depicted the structure of FIGS. 11A and 11B, respectively, after removing surface oxide layer 62 from the each structure. Surface oxide layer 62 can be removed utilizing an etch as described above for removing surface oxide layer 20 from the structure. In some embodiments, surface oxide layer 62 may remain atop each of the structures. See, FIGS. 11A and 11B.

Notwithstanding whether the surface oxide layer 62 is removed or not removed, this embodiment provides a semiconductor structure (See, for example, FIGS. 11A and 11B, 12A, and 12B) which include a buried oxide layer 60 having a thickness of less than 300 Å; and a material layer 56 which in some embodiments can have a dielectric constant of greater than silicon oxide. As illustrated in FIGS. 11A, 11B, 12A, and 12B, the buried oxide layer 60 and the material layer 56 are located between a top semiconductor layer 54 and a bottom semiconductor layer 52. In the illustrated embodiment, material layer 56 is a buried dielectric material that is based on a Si-based dielectric material as mentioned above. When porous Si is used as the material layer, the anneal forms cavities (not shown) within the substrate.

Reference is now made to FIGS. 13-16B which illustrate another embodiment of the present disclosure. This embodiment of the present disclosure is similar to the embodiment depicted in FIGS. 5-8 except that the semiconductor substrate 10 is replaced with the semiconductor substrate illustrated in FIG. 9.

Figure 13:
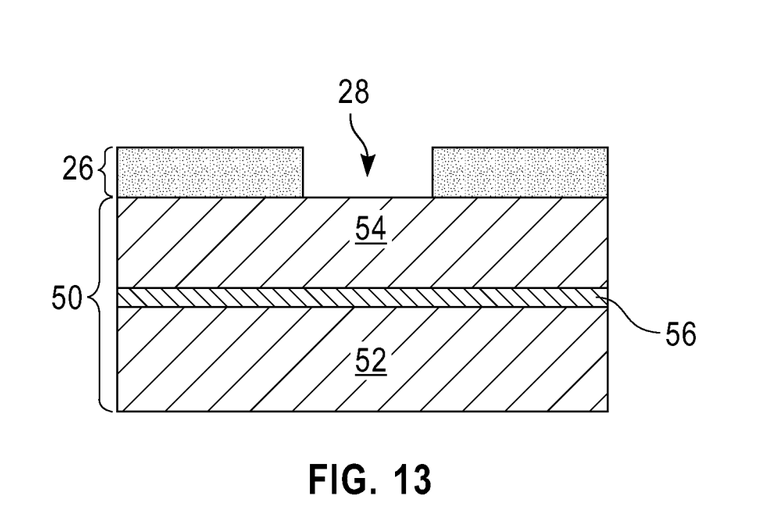
FIG. 13 is a pictorial representation (through a cross sectional view) illustrating the semiconductor substrate of FIG. 9 after forming a mask having at least one opening atop the semiconductor substrate.

Referring first to FIG. 13, there is illustrated the semiconductor substrate of FIG. 9 after forming a mask 26 having at least one opening 28 atop the semiconductor substrate 50. The mask 26 is comprised of one of materials mentioned above for the embodiment illustrated in FIG. 5, and the mask 26 is made utilizing the process mentioned above in forming mask 26 in the embodiment depicted in FIG. 5.

Figure 14A:
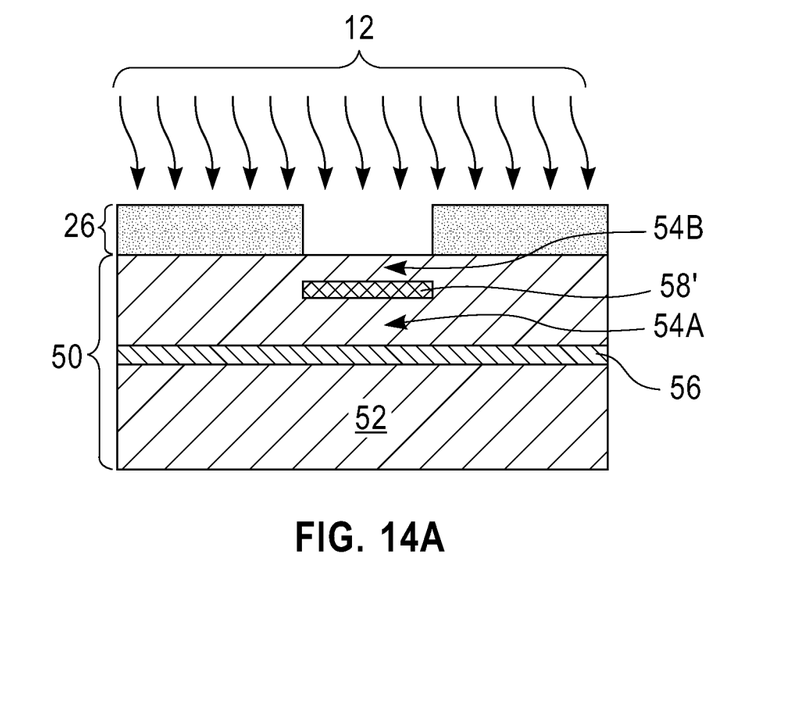
FIGS. 14A and 14B are pictorial representations (through cross sectional views) illustrating the semiconductor substrate of FIG. 13 during a step of implanting oxygen ions into a semiconductor material portion of the semiconductor substrate in an atmosphere containing oxygen and at a substrate temperature of greater than 600° C. utilizing an ion implant energy of less than 40 keV to form an implanted region containing oxygen ions within the semiconductor material portion of the semiconductor substrate.
Figure 14B:
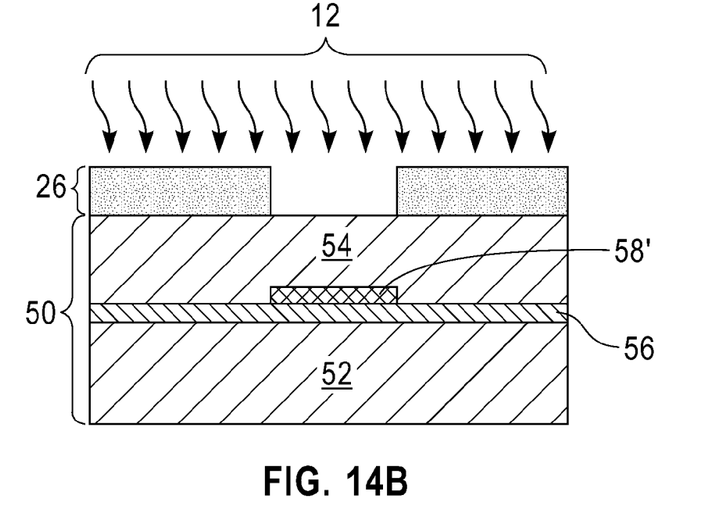

Referring now to FIGS. 14A and 14B, there are illustrated the semiconductor substrate of FIG. 13 during a step of implanting oxygen ions 12 into a semiconductor material portion of the semiconductor substrate 50 utilizing the conditions mentioned above for forming implanted region 16, i.e., implanting oxygen ions at a substrate temperature of greater than 600° C. utilizing an ion implant energy of less than 40 keV. The step of implanting oxygen forms an implanted region 58' containing oxygen ions within a semiconductor portion of the semiconductor substrate 50. The implanted region 58' of this embodiment is non-contiguous.

FIG. 14A represents an embodiment wherein the implanted region 58' containing oxygen ions is located above, but not in direct physical contact with the material layer 56. In this embodiment, a top semiconductor portion 54B of top semiconductor layer 54 remains above the implanted region 58', while a bottom semiconductor portion 54A of top semiconductor layer 54 remains below the implanted region 58.

FIG. 14B represents an embodiment wherein the implanted region 58' containing oxygen ions is located above and in direct physical contact with the material layer 56. In this embodiment, a portion of the top semiconductor layer 54 remains above the implanted region 58'.

Figure 15A:
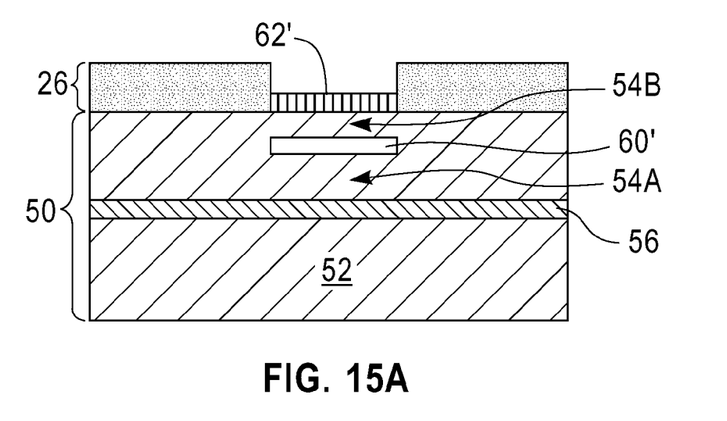
FIGS. 15A and 15B are pictorial representations (through cross sectional views) illustrating the structure of FIGS. 14A and 14B, respectively, after annealing the semiconductor substrate including the implanted region in an atmosphere containing oxygen and at a temperature of less than 1250° C. which converts the implanted region containing oxygen ions into a buried oxide layer having a thickness of less than 300 Å located between a top semiconductor layer and a bottom semiconductor layer.
Figure 15B:
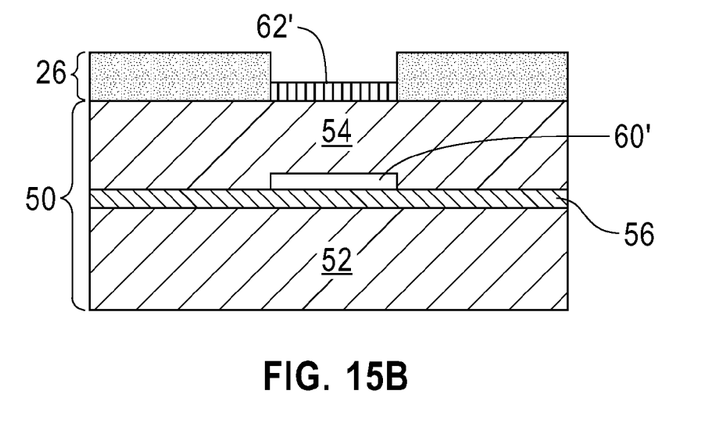

Referring now to FIGS. 15A and 15B, there are illustrated the structures of FIGS. 14A and 14B, respectively, after annealing the semiconductor substrate including the implanted region 58' to convert the implanted region into a non-contiguous buried oxide layer 60' having a thickness of less than 300 Å. The anneal that is employed in each illustrated embodiment is the same as that mentioned above for the embodiment illustrated in FIG. 3. Surface oxide layer 62' also forms atop the exposed uppermost surface of the SOI substrate 50. In each illustrated embodiment depicted in FIGS. 15A, 15B, 15C, and 15D the position of the buried oxide layer 60' coincides with the location of the implanted region 58' mentioned in FIGS. 14A and 14B. In the illustrated embodiments material layer 56 is a Si-based dielectric material. When porous Si is used as material layer 56, cavities (not shown) would form during the annealing process.

Figure 16A:
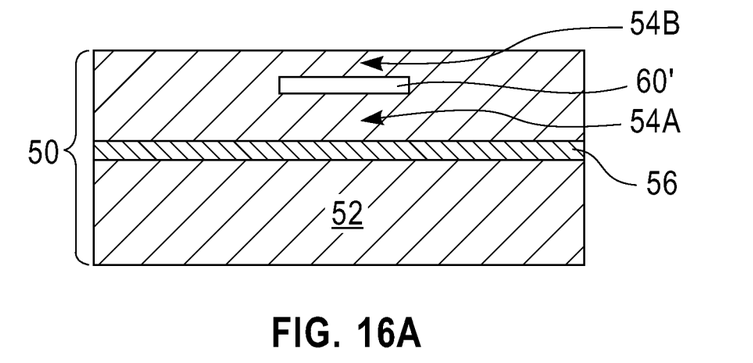
FIGS. 16A and 16B are pictorial representations (through cross sectional views) illustrating the structure of FIGS. 15A and 15B, respectively, after removing a surface oxide layer that formed atop the top semiconductor layer during the annealing.
Figure 16B:
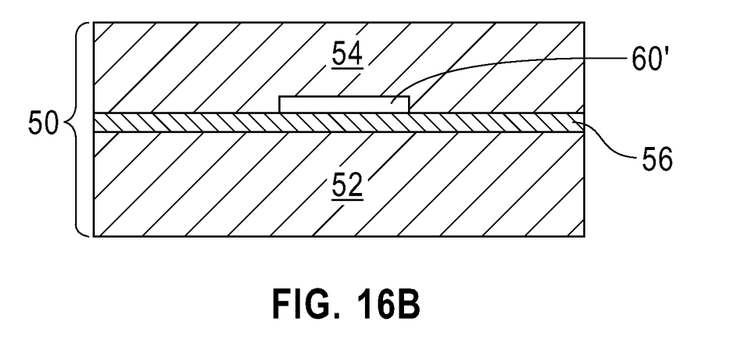

Referring now to FIGS. 16A and 16B, there are depicted the structure of FIGS. 15A and 15B, respectively, after removing the surface oxide layer 62' and mask 26 that are located atop the uppermost surface of SOI substrate 50. In some embodiments, surface oxide layer 62' can remain in the structure. The mask 26 and optionally surface oxide layer 62' can be removed utilizing one of the processed mentioned above for the embodiment depicted in FIG. 8 of the present disclosure.

Notwithstanding whether the surface oxide layer 62' is removed or not removed, this embodiment provides a semiconductor structure (See, for example, FIGS. 15A and 15B 16A, and 16B) which includes a buried oxide layer 60' having a thickness of less than 300 Å, and a material layer 56, which in some embodiments can have a dielectric constant of greater than silicon oxide. As illustrated in FIGS. 15A, 15B, 16A, and 16B, the buried oxide layer 60' and the material layer 56 (i.e., buried Si-based dielectric material) are located between a top semiconductor layer 54 and a bottom semiconductor layer 52.

Figure 17:
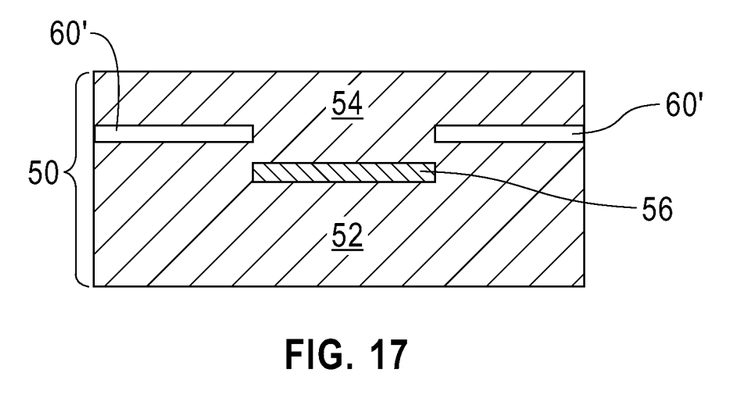
FIG. 17 is a pictorial representation (through a cross sectional view) illustrating another semiconductor structure that can be formed using the method of the present disclosure and a semiconductor substrate similar to the semiconductor substrate depicted in FIG. 9 except that the semiconductor substrate employed in this embodiment contains a non-contiguous dielectric material layer.

Reference is now made to FIG. 17 which illustrated another semiconductor structure that can be formed using the method of the present disclosure and a semiconductor substrate similar to the semiconductor substrate depicted in FIG. 9 except that the semiconductor substrate employed in this embodiment contains a non-contiguous material layer 56' (i.e., Si-based dielectric material) initially present between top and bottom semiconductor layers 54, 52. As illustrated, non-contiguous buried oxide layers 60' are formed which are laterally adjacent to the non-contiguous material layer 56'. In one embodiment, each non-continuous buried oxide layer 60' is located laterally adjacent to and vertically offset (above) from the material layer 56'. In some embodiments, at least one of the non-continuous buried oxide layers 60' is located laterally adjacent to and vertically offset (above) from the material layer 56'. In yet other embodiments, the each non-continuous buried oxide layer 60' is located laterally adjacent to and vertically aligned with the material layer 56'.

In any of the various embodiments mentioned above, at least one semiconductor device including for example, a planar transistor, non-planar transistor, capacitor, diode, and resistor can be formed using the SOI substrates that are provided in the present disclosure. The at least one semiconductor device can be formed utilizing techniques well known to those skilled in the art. The details of various methods that can be used in forming the at least one semiconductor device using the SOI substrates of the present disclosure have been omitted so as not to obscure the details of the present disclosure.

In some embodiments and as mentioned previously, an epitaxial semiconductor material can be formed atop the uppermost surface of the SOI substrate provided in the present disclosure to place the BOX at a desired depth below the semiconductor. By "epitaxial semiconductor material" it is meant that the semiconductor material has the same crystalline orientation as the uppermost surface of the SOI substrate that the epitaxial semiconductor material is in direct contact with.

Epitaxially growing, epitaxial growth and/or deposition" mean the growth of a semiconductor material on a deposition surface of a semiconductor material, in which the semiconductor material being grown has the same crystalline characteristics as the semiconductor material of the deposition surface. When the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation. In some embodiments, the epitaxial deposition process is a selective deposition process. More specifically, in one embodiment, the epitaxial semiconductor material being deposited is only deposited on semiconductor containing deposition surfaces.

The epitaxial semiconductor material that can be epitaxially deposited includes any semiconductor material such as, for example, silicon (Si), germanium (Ge), and silicon germanium (SiGe). It is noted that the these specific material compositions for the epitaxial semiconductor material are provided for illustrative purposes only, and are not intended to limit the present disclosure, as any semiconductor material that may be formed using an epitaxial growth process. A number of different sources may be used for the deposition of epitaxial silicon. In some embodiments, in which the epitaxial semiconductor material is composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. In some embodiments, in which the epitaxial semiconductor material is of germanium, the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the epitaxial semiconductor material is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

The temperature for epitaxial silicon deposition typically ranges from 550° C. to 900° C. Although higher temperature typically results in faster deposition, the faster deposition may result in crystal defects and film cracking. The apparatus for performing the epitaxial growth may include a chemical vapor deposition (CVD) apparatus, such as atmospheric pressure CVD (APCVD), low pressure CVD (LPCVD), plasma enhanced CVD (PECVD), metal-organic CVD (MOCVD) and others. The epitaxial semiconductor material that is deposited can be doped or undoped. By "undoped" it is meant that the maximum dopant concentration of p-type or n-type dopants that are present in the epitaxial semiconductor material is less than $5\times10^{17}$ atoms/cm$^3$.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed as new is:

1. A method of forming a semiconductor-on-insulator substrate comprising:
   providing a semiconductor substrate;
   implanting oxygen ions into a semiconductor material portion of the semiconductor substrate, wherein said implanting oxygen ions is performed at a substrate temperature of greater than 600° C. utilizing an ion implant energy of less than 40 keV to form an implanted region containing oxygen ions within said semiconductor material portion of said semiconductor substrate; and
   annealing said semiconductor substrate including said implanted region in an atmosphere containing oxygen and at a temperature of less than 1250° C. to convert said implanted region into a buried oxide layer having a thickness of less than 300 Å located between a top semiconductor layer and a bottom semiconductor layer, wherein during said annealing a surface oxide layer forms across an entire length of said semiconductor substrate.

2. The method of claim 1, wherein said substrate temperature is maintained with an ion beam power only during said implanting oxygen ions.

3. The method of claim 1, wherein said substrate temperature is maintained by a combination of an ion beam power used during said implanting oxygen and lamp heating or resistive heating in an ion implant chamber in which said implanting oxygen ions occurs.

4. The method of claim 1, wherein said implanting oxygen ions includes selecting one of singularly ionized oxygen, doubly ionized oxygen, multiple ionized oxygen, molecular oxygen or atomic oxygen as a source of oxygen.

5. The method of claim 1, wherein said atmosphere containing oxygen comprises a mixture of an inert gas and oxygen, wherein said oxygen is present in said mixture in an amount from 0.1 to 10%.

6. The method of claim 5, wherein said atmosphere containing oxygen is mixed with a chlorine containing vapor.

7. A method of forming a semiconductor-on-insulator substrate comprising:
providing a semiconductor substrate;
forming a mask having at least one opening that exposes an upper surface of the semiconductor substrate prior to implanting oxygen ions;
implanting oxygen ions into a semiconductor material portion of the semiconductor substrate, wherein said implanting oxygen ions is performed at a substrate temperature of greater than 600° C. utilizing an ion implant energy of less than 40 keV to form an implanted region containing oxygen ions within said semiconductor material portion of said semiconductor substrate, wherein said implanting oxygen ions occurs only through said at least one opening forming said implanted region containing oxygen ions that is surrounded by semiconductor material; and
annealing said semiconductor substrate including said implanted region in an atmosphere containing oxygen and at a temperature of less than 1250° C. to convert said implanted region into a buried oxide layer having a thickness of less than 300 Å located between a top semiconductor layer and a bottom semiconductor layer, wherein said annealing forms an island of said buried oxide layer that is surrounded entirely by said semiconductor material, said island of said buried oxide having outermost vertical edges that are vertically coincident with vertical edges of said at least one opening in said mask.

8. A method of forming a semiconductor-on-insulator substrate comprising:
providing a semiconductor substrate, said semiconductor substrate including a material layer selected from a Si-based dielectric material or porous Si;
implanting oxygen ions into a semiconductor material portion of the semiconductor substrate, wherein said implanting oxygen ions is performed at a substrate temperature of greater than 600° C. utilizing an ion implant energy of less than 40 keV to form an implanted region containing oxygen ions within said semiconductor material portion of said semiconductor substrate; and
annealing said semiconductor substrate including said implanted region and the material layer in an atmosphere containing oxygen and at a temperature of less than 1250° C. to convert said implanted region into a buried oxide layer having a thickness of less than 300 Å located within said semiconductor material portion of the semiconductor substrate, wherein during said annealing a surface oxide layer forms across an entire length of said semiconductor substrate.

9. The method of claim 8, wherein said substrate temperature is maintained with an ion beam power only during said implanting oxygen ions.

10. The method of claim 8, wherein said substrate temperature is maintained by a combination of an ion beam power used during said implanting oxygen and lamp heating or resistive heating in an ion implant chamber in which said implanting oxygen ions occurs.

11. The method of claim 8, wherein said implanting oxygen ions includes selecting one of singularly ionized oxygen, doubly ionized oxygen, multiple ionized oxygen, molecular oxygen or atomic oxygen as a source of oxygen.

12. The method of claim 8, wherein atmosphere containing oxygen comprises a mixture of an inert gas and oxygen, wherein said oxygen is present in said mixture in an amount from 0.1 to 10%.

13. The method of claim 12, wherein said atmosphere containing oxygen is mixed with a chlorine containing vapor.

14. A method of forming a semiconductor-on-insulator substrate comprising:
providing a semiconductor substrate, said semiconductor substrate including a material layer selected from a Si-based dielectric material or porous Si;
forming a mask having at least one opening that exposes an upper surface of the semiconductor substrate prior to implanting oxygen ions;
implanting oxygen ions into a semiconductor material portion of the semiconductor substrate, wherein said implanting oxygen ions is performed at a substrate temperature of greater than 600° C. utilizing an ion implant energy of less than 40 keV to form an implanted region containing oxygen ions within said semiconductor material portion of said semiconductor substrate, wherein said implanting oxygen ions occurs only through said at least one opening forming said implanted region containing oxygen ions that is surrounded by semiconductor material; and
annealing said semiconductor substrate including said implanted region and the material layer in an atmosphere containing oxygen and at a temperature of less than 1250° C. to convert said implanted region into a buried oxide layer having a thickness of less than 300 Å located within said semiconductor material portion of the semiconductor substrate, said annealing forms an island of said buried oxide layer that is surrounded by said semiconductor material, and said island of said buried oxide having outermost vertical edges that are vertically coincident with vertical edges of said at least one opening in said mask.

* * * * *